(12) United States Patent
Wich et al.

(10) Patent No.: US 7,236,043 B2
(45) Date of Patent: Jun. 26, 2007

(54) ANTIFUSE PROGRAMMING, PROTECTION, AND SENSING DEVICE

(75) Inventors: Mathew T. Wich, Colorado Springs, CO (US); Vincent Gosmain, Aix-en-Province (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/252,180

(22) Filed: Oct. 17, 2005

(65) Prior Publication Data

US 2007/0085593 A1 Apr. 19, 2007

(51) Int. Cl.
*H01H 85/00* (2006.01)

(52) U.S. Cl. .................................... 327/525; 365/225.7

(58) Field of Classification Search ............ 327/50–51, 327/525; 365/96, 225.7
See application file for complete search history.

(56) References Cited

U.S. PATENT DOCUMENTS

| | | | |
|---|---|---|---|
| 5,418,487 A | 5/1995 | Armstrong, II | 327/525 |
| 5,731,733 A | 3/1998 | Denham | 327/325 |
| 5,789,970 A | 8/1998 | Denham | 327/525 |
| 6,426,668 B1 | 7/2002 | Morrish et al. | 327/525 |
| 6,618,311 B1 | 9/2003 | Becker | 365/225.7 |
| 6,628,561 B2 * | 9/2003 | Van De Graaff | 365/225.7 |
| 6,762,819 B2 * | 7/2004 | Lee | 349/156 |
| 2003/0234665 A1 | 12/2003 | Smith et al. | 326/37 |

* cited by examiner

*Primary Examiner*—Dinh T. Le
(74) *Attorney, Agent, or Firm*—Schneck & Schneck; Thomas Schneck

(57) ABSTRACT

An antifuse programming, protection, and sensing device incorporates a control circuit to program and protect an antifuse. The antifuse, which is initially constructed as a low conductivity path, is programmable to a high conductivity path by application of an elevated voltage across terminals of the antifuse. Application of 0 volts to the $V_{DD}$ node of a conduction control portion of the antifuse programming, protection, and sensing device allows an elevated voltage for programming to be applied to the antifuse. Upon application of a nominal working voltage to the $V_{DD}$ node of the conduction control circuitry, the antifuse and an adjoining sense amplifier circuit are protected from overvoltage and tampering. The sense amplifier supplies a sense current to the antifuse, measures a voltage at an input to the antifuse, and determines a programmed state if a measured voltage level is low.

19 Claims, 2 Drawing Sheets

# ANTIFUSE PROGRAMMING, PROTECTION, AND SENSING DEVICE

TECHNICAL FIELD

The present invention relates to a control circuit for antifuse technology. In particular, the present invention relates to a programming, protection, and sensing device for an antifuse cell.

BACKGROUND ART

Antifuses are used in integrated circuits to provide various circuit selection and configuration functions. When fabricated in a MOS technology, analog components, such as comparators or amplifiers, for example, may require an adjustment of operating parameters. Antifuses are used to select device configurations to effect parameter value adjustments.

The antifuse is blown by applying a higher than normal voltage or laser beam to the antifuse. The high voltage, for example, produces a short circuit where an open circuit once existed. The application of the laser beam creates a similar short circuit condition. The blown antifuse alters a high impedance situation to a current conducting path that effects a change in a logic level with an applied current. The antifuse generally comprises two conductors, either metal and/or a semiconductor material, having some kind of dielectric or insulating material between the two conductors. In recent practice the dielectric is set to approximately half the normal thickness of a thin oxide FET gate. In the presence of high voltage or laser power the thin oxide is electrically broken down to change from a non-conducting to a conducting condition. The change in conduction is done without affecting any remaining components of a circuit.

For sensing the logic state of the antifuse device, a sense amplifier is provided to identify the antifuse device to be either non-conducting or conducting. However, the sense amplifier should require very low power consumption in the application of complex communications integrated circuits. In order to satisfy a requirement for low power, small devices are used in the sense amplifier which are susceptible to damage due to overvoltage. What is needed is a device capable of providing both programming capability of the antifuse and electrical isolation from overvoltage of the accompanying sense amplifier.

SUMMARY

An antifuse programming, protection, and sensing device incorporates a control circuit to program and protect an antifuse. The antifuse, which is initially constructed as a low conductivity path, is programmable to a high conductivity path by application of an elevated voltage across terminals of the antifuse. Application of 0 volts to the $V_{DD}$ node of a conduction control portion of the antifuse programming, protection, and sensing device allows an elevated voltage for programming to be applied to the antifuse. Upon application of a nominal working voltage to the $V_{DD}$ node of the conduction control circuitry, the antifuse and an adjoining sense amplifier circuit are protected from overvoltage.

The electrical path to the antifuse for applying the elevated programming voltage and for providing electrical protection from overvoltage and tampering is attained by the same network of devices. The application of one of the two different levels of $V_{DD}$ alternates the programming and protection network between the two modes of operation.

Additionally, the network for electrically isolating the sense amplifier circuitry also, alternatively, electrically couples the sense amplifier with the same two levels of $V_{DD}$. The sense amplifier supplies a sense current to the antifuse, measures a voltage at an input to the antifuse, and determines a programmed state if a measured voltage level is low.

DETAILED DESCRIPTION

Figure 1:
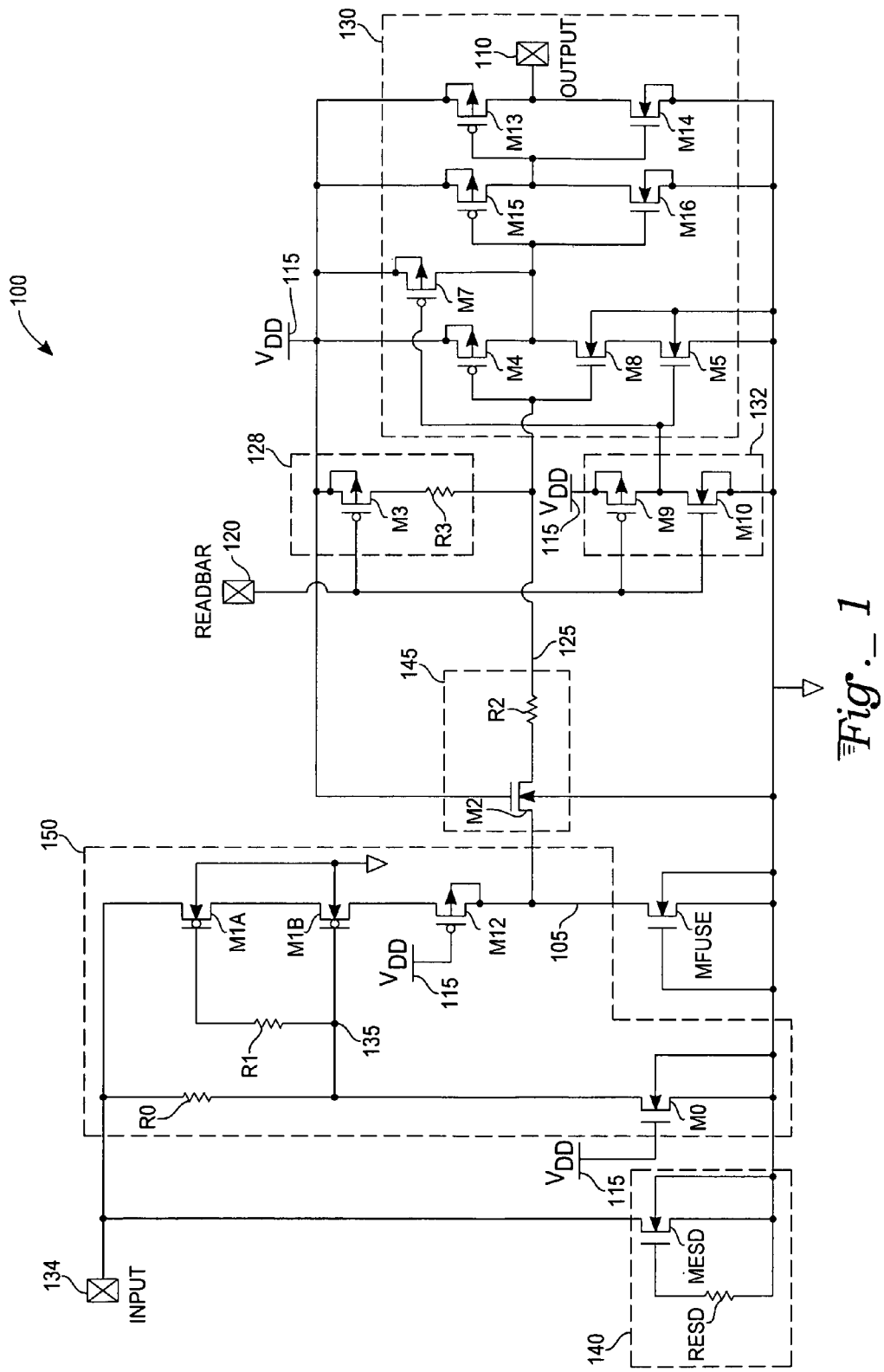
FIG. 1 is a schematic diagram of an exemplary antifuse programming, protection, and sensing device.

With reference to FIG. 1, an exemplary antifuse programming, protection, and sensing device contains an antifuse MFUSE. The antifuse MFUSE is a thin oxide NMOS transistor. The antifuse MFUSE is fabricated with a gate node, a source node, and a body node tied to ground level so that a conduction path through the antifuse MFUSE, from a drain node to ground, is highly resistive. In this configuration the antifuse MFUSE is considered an open circuit.

The antifuse MFUSE is connected between a VFUSE node 105 and ground. With a sufficiently high voltage applied to a drain of the antifuse MFUSE, it is damaged (blown) producing a low resistance path from the drain of the VFUSE node 105 to ground. In this state the antifuse MFUSE can be considered a short circuit.

A sense amplifier 130, containing a NAND gate structure M4, M8, M5, and M7 and a buffer M15, M16, M13, and M14, is used to sense the antifuse MFUSE and determine if it has been blown or not. An OUTPUT pad 110 communicates a BLOWN signal (not shown), which is a digital logic signal indicating the antifuse MFUSE state. In some applications, the BLOWN signal can be used to enable or disable on-chip circuitry depending on the state of the antifuse MFUSE.

To read the antifuse MFUSE, a $\overline{READ}$ signal is applied at a READBAR input 120. The READBAR input 120 connects to the input of a logic inversion device 132 comprised of a first pullup device M9 and a pulldown device M10. The antifuse MFUSE state is read when, for example, 1.8 Volts (V) is applied to the $V_{DD}$ node 115 and the $\overline{READ}$ signal is driven to the logic level 0. When the antifuse MFUSE is blown, a low resistance path is created from the VFUSE node 105 to ground. A bias circuit 128 is made from a second pullup device M3 and a bias resistor R3. A coupling circuit 145 is made from a transmission gate M2 and a series resistor R2. The coupling circuit 145 is used with a blown antifuse MFUSE to pull down a voltage at the VFUSE_PROTECTED node 125 against the weaker pullup current presented by the bias circuit 128. The low resistance path from the VFUSE node 105 to ground is small enough compared to the bias resistor R3 to allow the signal at the VFUSE_PROTECTED node 125 to attain a voltage less than a maximum for a logic level zero. The bias resistor R3 is selected to be approximately greater than, for example, ten times the value of the low resistance path of the blown antifuse MFUSE. When the potential at the VFUSE_PROTECTED node 125 is pulled low, the sense amplifier 130 has the logic level 0 input and thus drives the BLOWN signal to a logic level 1 at the OUTPUT pad 110.

When the antifuse MFUSE is not blown, there is no conduction path from the VFUSE node 105 to ground. The bias circuit 128 pulls the potential at the VFUSE_PROTECTED node 125 up to the logic level 1. When the $\overline{\text{READ}}$ signal is the logic level 0, due to the presence of the logic inversion device 132, the NAND gate structure M4, M8, M5, and M7 of the sense amplifier 130 has only logic level 1's on its input and thus drives the BLOWN signal to a logic level 0. When the $\overline{\text{READ}}$ signal is at the logic level 1, the BLOWN signal is driven to the logic level 1 regardless of the state (blown or not) of the antifuse MFUSE.

A control circuit 150 is comprised of a pulldown protection device M0, a first pullup resistor R0, a second resistor R1, a first zero threshold device M1A, a second zero threshold device M1B, and a series coupling device M12. The control circuit 150 is used to either open or close a conduction path from an INPUT pad 134 to the VFUSE node 105. The control circuit 150 produces a conduction path when the antifuse MFUSE is to be blown. The control circuit 150 is effectively a protection device when the conduction path is open. The conduction path is open when the potential at the $V_{DD}$ node 115 is powered to a high level of, for example, 1.8 V. With the conduction path open, the state of the antifuse MFUSE can be properly sensed.

The antifuse MFUSE is blown by applying a programming voltage (not shown) greater than 10 V to the INPUT pad 134, 0 V to ground, and a 0 V potential to the $V_{DD}$ node 115. Under these conditions the pulldown protection device M0 in the control circuit 150 and the transmission gate M2 in the coupling circuit 145 are "off." With the pulldown protection device M0 and the transmission gate M2 "off," a voltage at an M1GATE node 135 rises to greater than 10 V with the programming voltage applied. The first zero threshold device M1A and the second zero threshold device M1B are thick-oxide NMOS devices with threshold voltages ($V_T$) near 0 V. When the first zero threshold device M1A and the second zero threshold device M1B are turned "on," a potential at a source node of the series coupling device M12 rises to greater than 10 V and the series coupling device M12 is turned "on." With the series coupling device M12 turned "on," a potential greater than 10 V is applied to the VFUSE node 105. A potential at the VFUSE node 105 being greater than 10 V is sufficient to blow the antifuse MFUSE.

With a nominal voltage of, for example, 1.8 V applied to the $V_{DD}$ node 115, the pulldown protection device M0 turns "on" and pulls a gate of the first zero threshold device M1A and a gate of the second zero threshold device M1B to about 0V. The series combination of the first zero threshold device M1A, the second zero threshold device M1B, and the series coupling device M12 is a highly resistive path between the INPUT pad 134 and the VFUSE node 105. The highly resistive path allows the antifuse MFUSE state to be properly sensed.

Additional considerations are included to prevent tampering with circuit operation. The INPUT pad 134 node is typically connected to a package bonding pad. In a case where the antifuse MFUSE is blown, the sense amplifier 130 indicates the incorrect state of the antifuse MFUSE if excessive voltage on the INPUT pad 134 causes the potential at the VFUSE node 105 to rise to a level causing an erroneous measurement. The present invention is designed to prevent excessive voltage on the INPUT pad 134 from raising the potential at the VFUSE node 105 while a nominal voltage is applied to the $V_{DD}$ node 115.

As discussed supra, when the nominal voltage is applied to the $V_{DD}$ node 115, a voltage at the M1GATE node 135 is pulled low by the pulldown protection device M0. When voltage is applied to the INPUT pad 134, a very small current can flow from the INPUT pad 134 to the VFUSE node 105. However, the current is not large enough to cause the antifuse MFUSE state to be sensed incorrectly.

If enough voltage is applied to the drain of the first zero threshold device M1A to cause punchthrough, the source of the first zero threshold device M1A rises in voltage and limits the punchthrough current. The limited current and voltage is not enough to subsequently cause punchthrough of the second zero threshold device M1B. Therefore, the path from the INPUT pad 134 to the VFUSE node 105 does not become more conductive and thus protects the antifuse MFUSE.

With an increase in voltage on the INPUT pad 134 the possibility of breaking down the drain-oxide junction of the first zero threshold device M1A is present. If such a breakdown occurs, R1 prevents the voltage at the M1GATE node 135 from rising, thus preventing significant current flow from the INPUT pad 134 to the VFUSE node 105.

An electrostatic discharge device 140 is made from an electrostatic discharge transistor MESD and an electrostatic discharge resistor RESD. With a further increase in voltage applied to the INPUT pad 134, damage to the drain junction of the discharge transistor MESD or the first zero threshold device M1A may occur and cause a low resistance from the INPUT pad 134 to ground. The low resistance path prevents the INPUT pad 134 voltage from increasing.

The coupling circuit 145 protects the sense amplifier 130 connected to the VFUSE_PROTECTED node 125. When the potential at the $V_{DD}$ node 115 equals 0 V and a high voltage is applied on the INPUT pad 134, the transmission gate M2 is "off" preventing high voltage from reaching the VFUSE_PROTECTED node 125. The series resistor R2 limits any possible high current flow to the VFUSE_PROTECTED node 125.

With a voltage greater than 10 V applied to the INPUT pad 134 and the potential at the $V_{DD}$ node 115 equal to 0 V, the second zero threshold device M1B continues to be protected from damage causing a condition of continuing conduction after the potential at the $V_{DD}$ node 115 returns to the nominal operating voltage. With continued rising voltage on the INPUT pad 134, the pulldown protection device M0 enters snapback breakdown, which in combination with the first pullup resistor R0 limits the potential at the M1GATE node 135 to a magnitude less than a breakdown voltage. As the potential at the INPUT pad 134 continues to rise, the discharge transistor MESD is damaged and produces a low resistance path to ground. The low resistance path prevents the voltage on the INPUT pad 134 from rising further.

Figure 2:
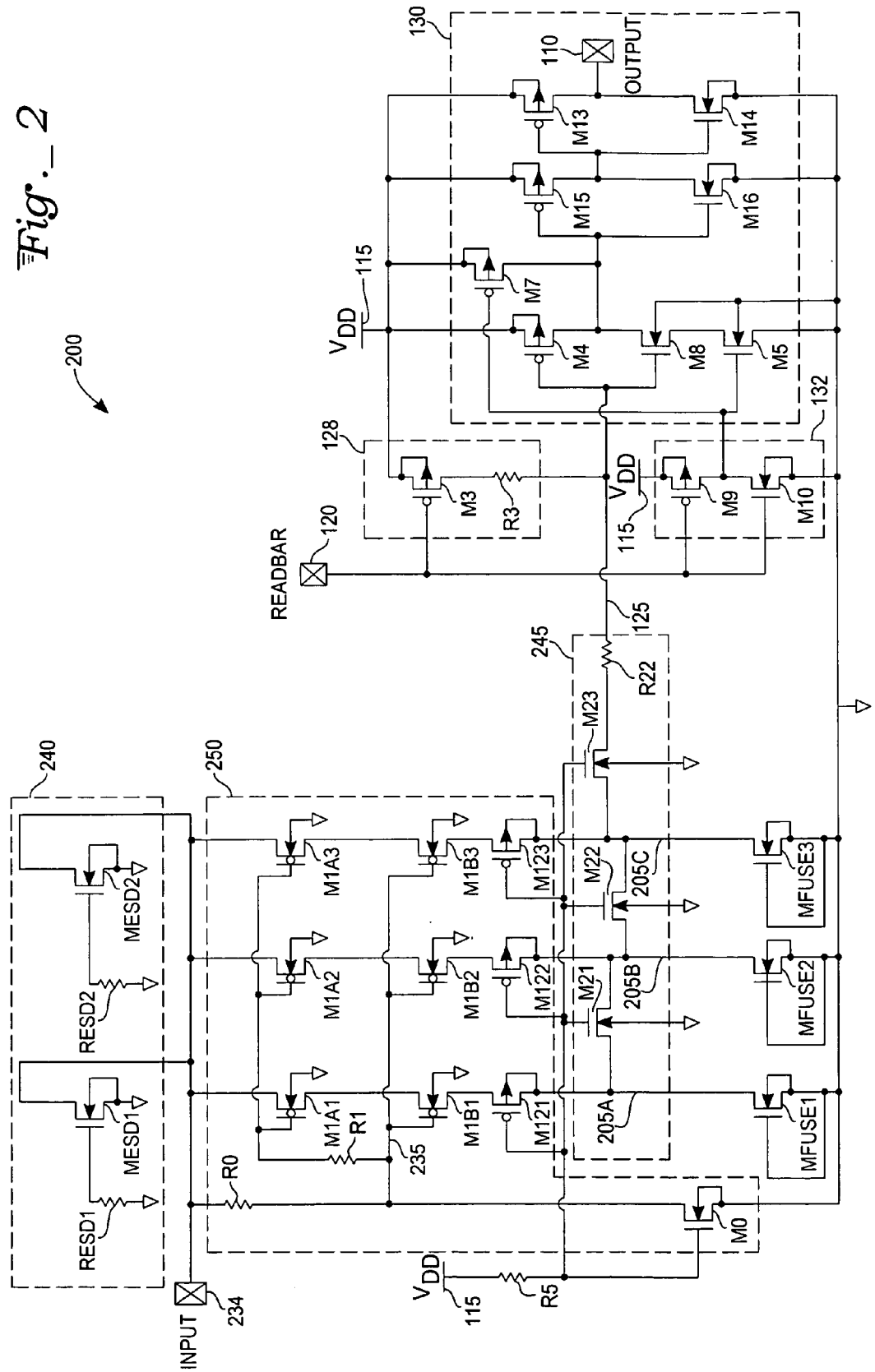
FIG. 2 is a schematic diagram of another embodiment of an exemplary antifuse programming, protection, and sensing device with a plurality of antifuse devices.

With reference to FIG. 2, a schematic diagram of another embodiment of an exemplary antifuse programming, protection, and sensing device contains a plurality of antifuse devices MFUSE1, MFUSE2, and MFUSE3 each connected to a corresponding one of a plurality of VFUSE nodes 205A, 205B, and 205C. With the plurality of antifuse devices MFUSE1, MFUSE2, and MFUSE3, redundancy is added to the circuit and reliability is increased. Additionally, each of the plurality of antifuse devices MFUSE1, MFUSE2, and MFUSE3 is connected to a corresponding one of a plurality of series coupling devices M121, M122, and M123. The plurality of series coupling devices M121, M122, and M123 are each connected to a corresponding one of a plurality of second zero threshold devices M1B1, M1B2, and M1B3; each of the plurality of second zero threshold devices M1B1, M1B2, and M1B3 is connected to a corresponding one of a plurality of first zero threshold devices M1A1, M1A2, and M1A3; and are each connected to an INPUT pad 234. A control circuit 250 is comprised of a pulldown protection device M0, a first pullup resistor R0, a second resistor R1, the plurality of first zero threshold devices M1A1, M1A2, and M1A3, the plurality of second zero threshold devices M1B1, M1B2, and M1B3, and the plurality of series coupling devices M121, M122, and M123. Operation of the control circuit is as discussed supra with reference to FIG. 1, with the plurality of devices operating in parallel, as indicated, for redundancy.

Within a coupling circuit 245, a plurality of transmission gates M21, M22, and M23 connect in series to provide a path for the plurality of antifuse devices MFUSE1, MFUSE2, and MFUSE3 to connect with a series resistor R22. The coupling circuit connects to the VFUSE_PROTECTED node 125 which is connected to an input of the sense amplifier 130. Each one of the plurality of transmission gates M21, M22, and M23, the plurality of series coupling devices M121, M122, and M123, and the pulldown protection device M0 have a control input connected to a third pullup resistor R5 which is connected to the $V_{DD}$ node 115 to provide bias levels for programming and protection as described supra with reference to FIG. 1. The sense amplifier 130, bias circuit 128, and logic inversion device 132 are connected an behave as described supra.

An electrostatic discharge device 240 is comprised of a plurality of electrostatic discharge transistors MESD1, MESD2 connected in parallel to the INPUT pad 234. Each one of the plurality of electrostatic discharge transistors MESD1, MESD2 is biased with a plurality of electrostatic discharge resistors RESD1, RESD2. Each one of the combinations taken from the plurality of electrostatic discharge transistors MESD1, MESD2 and the plurality of electrostatic discharge resistors RESD1, RESD2 operates the same as the electrostatic discharge device 140 described supra with reference to FIG. 1. A paralleling of components within the electrostatic discharge device 240 adds redundancy and reliability to the antifuse programming, protection, and sensing device.

While various portions of an exemplary antifuse programming, protection, and sensing device have been depicted with exemplary components and configurations, an artisan in the field of controllers of electronic storage circuits would readily recognize alternative embodiments for accomplishing a similar result. For instance, a bias circuit has been represented as a PMOS pullup transistor in series with a resistor. One skilled in the art would recognize that a pullup device may be realized from either an NMOS device with a compensated gate voltage, an NMOS device with an aspect ratio appropriate for beta ratioing, or from a pullup resistor alone. Even though a sense amplifier has been portrayed as a NAND gate structure with series buffer, a skilled artisan would recognize that a level sensing device or voltage sensing circuit configured from a differential amplifier or instrumentation amplifier would achieve an equivalent result.

As further examples, even though a coupling circuit has been shown being implemented from a single NMOS transmission gate and series resistor, an artisan skilled in the field could achieve an equivalent coupling circuit with a parallel combination of NMOS and PMOS transistors with complementary control inputs in series with a resistor. While a logic inversion device has been shown driven by a complementary read control signal and in turn shown driving an adjacent input of a NAND gate to effect gating of a signal on the adjacent input to the NAND gate, one skilled in the art would be able to accomplish the same control with a gating logic device composed of a transmission gate, driven by the control signal, in series with a buffer.

While an antifuse has been presented as a thin oxide NMOS transistor, one skilled in the art would recognize that the programmability of an additive or subtractive fuse-like characteristic is realizable through electrically configurable conduction devices such as laser programmed fuses, thin ONO (oxide-nitride-oxide) layers sandwiched between a polysilicon layer over an n+ diffusion, or EPROMs. These and further changes to the structure and fabrication of the present invention are readily contemplated in light of the disclosed material. Therefore, the specification and drawings are to be regarded in an illustrative rather than a restrictive sense.

What is claimed is:

1. An electrical conduction control and sending device comprising:
    a control circuit coupled to an input of the electrical conduction control and sensing device;
    an electrically configurable conduction device coupled to the control circuit, the electrically configurable conduction device having a low conductivity and capable of having a high conductivity;
    a sense amplifier coupled to the electrically configurable conduction device, the sense amplifier capable of producing a sense current, detecting a magnitude of voltage produced by the sense current, and producing a blown signal at an output of the electrical conduction control and sensing device; and
    a coupling circuit coupled to the electrically configurable conduction device and the sense amplifier, the coupling circuit having means for electrically communicating the sense current produced by the sense amplifier to the electrically configurable conduction device when the coupling circuit is enabled and for electrically protecting the sense amplifier when the coupling circuit is disabled.

2. The electrical conduction control and sensing device of claim 1, wherein the control circuit has means for programming the electrically configurable conduction device and protecting the electrically configurable conduction device from overvoltage.

3. The electrical conduction control and sensing device of claim 2, wherein the electrical conduction control and sensing device further comprises electrostatic protection devices and the control circuit further comprises protection devices for providing tampering prevention by preventing an excessive voltage applied to the input of the electrical conduction control and sensing device from raising a voltage across the electrically configurable conduction device and causing an erroneous measurement by the sense amplifier, the preventing of excessive voltage activated while a nominal voltage is applied to a supply node of the electrical conduction control and sensing device and the protection devices of the control circuit.

4. The electrical conduction control and sensing device of claim 1, further comprising a logic gating device coupled to the sense amplifier, the logic gating device capable of communicating a control signal applied to a control input of the logic gating device.

5. The electrical conduction control and sensing device of claim 1, wherein the means for electrically protecting the sense amplifier comprises an electrical isolation element.

6. The electrical conduction control and sensing device of claim 1, wherein the sense amplifier has both means for measuring a voltage across the electrically configurable conduction device due to the sense current applied and means f or determining a programmed or non-programmed state of the electrically configurable conduction device.

7. An electrical conduction control and sensing device comprising:
- a control circuit coupled to an input of the electrical conduction control and sensing device;
- an electrically configurable conduction device coupled to the control circuit, the electrically configurable conduction device having a low conductivity and capable of having a high conductivity;
- a bias circuit coupled to the electrically configurable conduction device, the bias circuit capable of producing a sense current;
- a level sensing device coupled to the bias circuit, the level sensing device capable of detecting a voltage level produced by the sense current and producing a blown signal at an output of the electrical conduction control and sensing device; and
- a coupling circuit coupled between the electrically configurable conduction device, the level sensing device, and the bias circuit, the coupling circuit having both means for electrically communicating the sense current produced by the bias circuit to the electrically configurable conduction device when the coupling circuit is enabled and means for electrically protecting the level sensing device when the coupling circuit is disabled.

8. The electrical conduction control and sensing device of claim 7, wherein the control circuit is configured to have a first plurality of configuring voltages applied and further has means for providing electrical protection of the electrically configurable conduction device.

9. The electrical conduction control and sensing device of claim 8, wherein the electrical conduction control and sensing device further comprises electrostatic protection devices and the control circuit further comprises protection devices for providing tampering prevention by preventing an excessive voltage applied to the input of the electrical conduction control and sensing device from raising a voltage across the electrically configurable conduction device and causing an erroneous measurement by the level sensing device, the preventing of excessive voltage activated while the first plurality of configuring voltages is applied to a supply node of the electrical conduction control and sensing device and the protection devices of the control circuit.

10. The electrical conduction control and sensing device of claim 7, wherein the control circuit is configured to have a second plurality of configuring voltages applied and further has means for providing programming of the electrically configurable conduction device.

11. The electrical conduction control and sensing device of claim 7, further comprising a logic gating device coupled to the level sensing device, the logic gating device capable of communicating a control signal applied to a control input of the logic gating device.

12. The electrical conduction control and sensing device of claim 7, wherein the means for electrically protecting the level sensing device comprises an electrical isolation element.

13. The electrical conduction control and sensing device of claim 7, further comprising a means for associating the voltage level produced by the sense current applied to the electrically configurable conduction device to determine either a non-programmed state or a programmed state with a resultant blown signal produced at the output of the electrical conduction control and sensing device.

14. A programming, protection, and sensing device comprising:
- a programming device coupled to an input of the programming protection, and sensing device;
- an antifuse coupled to the programming device, the antifuse having a low conductivity and capable of having a high conductivity;
- a bias circuit coupled to the antifuse and capable of producing a sense current;
- a voltage sensing circuit coupled to the bias circuit and capable of detecting a voltage level produced by the sense current and producing a blown signal at an output of programming, protection, and sensing device;
- a coupling circuit coupled between the antifuse and the voltage sensing circuit, the coupling circuit capable of electrically communicating the sense current produced by the bias circuit to the antifuse when the coupling circuit is enabled and electrically protecting the voltage sensing circuit when the coupling circuit is disabled; and
- a logic gating device coupled to the voltage sensing circuit and capable of communicating a control signal applied to a control of the logic gating device.

15. The programming, protection, and sensing device of claim 14, wherein the voltage sensing circuit is further capable of determining a programmed or non-programmed state front the detected voltage level across the antifuse and further producing the blown signal upon determination of a programmed state.

16. An electrical conduction control and sensing device comprising:
- a programmable electronic storage device;
- a means for controlling configuration and protection of the programmable electronic storage device, the controlling means coupled to an input of the electrical conduction control and sensing device and the programmable electronic storage device;
- a means for protecting the electrical conduction control and sensing device, the protecting means coupled to the input of the electrical conduction control and sensing device;
- a means for sensing a condition of electrical conductivity, the sensing means coupled to the programmable electronic device;
- a means for coupling the sensing means, the coupling means coupled to the sensing means, the programmable electronic storage device, and the controlling means; and
- a means for gating a sense voltage across the programmable electronic storage device, the gating means coupled to the sensing means and a control input to the gating means.

17. The electrical conduction control and sensing device of claim 16, wherein a first plurality of voltages applied to the controlling means programs the programmable electronic storage device and a second plurality of voltages applied to the controlling means protects the programmable electronic storage device.

18. The electrical conduction control and sensing device of claim 17, wherein the electrical conduction control and sensing device further comprises at least one electrostatic protection device and the controlling means further comprises at least one protection device for providing tampering prevention by preventing an excessive voltage applied to the input of the electrical conduction control and sensing device from raising a voltage across the electrically configurable conduction device and causing an erroneous measurement by the sensing means, the preventing of excessive voltage activated while the second plurality of voltages is applied to a supply node of the electrical conduction control and sensing device and the at least one protection device of the controlling means.

19. The electrical conduction control and sensing device of claim 16, wherein the sensing means further applies a current to the programmable electronic storage device and senses a resultant voltage across the programmable electronic storage device to determine a programmed state.

\* \* \* \* \*